United States Patent [19]

Magdo et al.

[11] 3,861,968

[45] Jan. 21, 1975

[54] METHOD OF FABRICATING INTEGRATED CIRCUIT DEVICE STRUCTURE WITH COMPLEMENTARY ELEMENTS UTILIZING SELECTIVE THERMAL OXIDATION AND SELECTIVE EPITAXIAL DEPOSITION

[75] Inventors: Ingrid E. Magdo; Steven Magdo, both of Hopewell Junction, N.Y.

[73] Assignee: International Business Machines Corporation, Armonk, N.Y.

[22] Filed: June 19, 1972

[21] Appl. No.: 263,881

[52] U.S. Cl. ...................... 148/175, 29/578, 29/580, 117/201, 148/191, 357/23, 357/40, 357/42, 357/44, 357/50

[51] Int. Cl. .......................... H01l 7/36, H01l 27/02

[58] Field of Search .................... 148/174, 175, 191; 317/234, 235; 29/578, 580; 117/201

[56] References Cited

UNITED STATES PATENTS

| | | | |
|---|---|---|---|
| 3,206,339 | 9/1965 | Thornton | 148/175 |
| 3,296,040 | 1/1967 | Wigton | 148/175 |
| 3,386,865 | 6/1968 | Doo | 148/175 |
| 3,442,011 | 5/1969 | Strieter | 29/578 |
| 3,534,234 | 10/1970 | Clevenger | 317/235 |
| 3,550,292 | 12/1970 | Irie et al. | 148/175 X |
| 3,648,125 | 3/1972 | Peltzer | 317/235 |

FOREIGN PATENTS OR APPLICATIONS

| | | | |
|---|---|---|---|
| 2,104,776 | 8/1971 | Germany | 148/175 UX |

OTHER PUBLICATIONS

Maheux, L., "Transistor for Monolithic Circuit," IBM Tech. Discl. Bull., Vol. 11, No. 12, May 1969, p. 1690–1691.

Appels et al., "Local Oxidation of Silicon -Device Technology," Philips Res. Repts., V. 25, April, 1970, p. 118–132.

*Primary Examiner*—L. Dewayne Rutledge
*Assistant Examiner*—W. G. Saba
*Attorney, Agent, or Firm*—Wolmar J. Stoffel

[57] ABSTRACT

A method of fabricating a planar dielectrically isolated semiconductor device by depositing a surface layer of dielectric material on a major surface of a monocrystalline substrate, removing portions of the layer to define annular channels, thermally oxidizing the exposed surface areas thereby forming annular ridges of $SiO_2$, removing portions of the dielectric layer, selectively growing an epitaxial silicon layer over the surface wherein the surfaces of the annular ridges of $SiO_2$ and the regions of epitaxial silicon are substantially coplanar.

A semiconductor integrated circuit device having a silicon epitaxial layer on a monocrystalline substrate, a network of thermally oxidized silicon regions extending through the epitaxial layer, across the epitaxial layer-substrate interface and into the silicon substrate, the network separating the epitaxial silicon layer into individual pockets, a laterally extending region of low resistivity located generally at the epitaxial layer-substrate interface embodying a first conductivity type impurity, the first type impurity distribution in the epitaxial layer such that the concentration increases with depth.

5 Claims, 2 Drawing Figures

METHOD OF FABRICATING INTEGRATED CIRCUIT DEVICE STRUCTURE WITH COMPLEMENTARY ELEMENTS UTILIZING SELECTIVE THERMAL OXIDATION AND SELECTIVE EPITAXIAL DEPOSITION

BACKGROUND OF THE INVENTION

This invention relates to methods of forming dielectrically isolated semiconductor devices adapted to form a part of an integrated circuit preferably, complementary transistor devices and structure.

DESCRIPTION OF THE PRIOR ART

The advanced form of integrated circuits is the so-called monolithic form. Such a structure contains great numbers of active and passive devices in a block or monolith of semiconductor material. Electrical connections between these active and passive components are generally made on the surface of the semiconductor block of material. The usual way of electrically isolating components, where it is desired, within the monolithic block of silicon is by what is called junction isolation wherein, for example, active P type diffusions are used to electrically isolate conventional NPN bipolar devices from one another and from other components such as resistors and capacitors. For a more detailed description of this type of junction isolation, the following patents may be referred to: W. E. Mutter, U.S. Pat. No. 3,319,311 issued May 16, 1967 and U.S. Pat. No. 3,451,866 issued June 24, 1969, and B. Agusta, et al., U.S. Pat. No. 3,508,209 issued Apr. 21, 1970.

Another form of electrical isolation between active and passive devices which has been suggested is called dielectric isolation. In this type of isolation, pockets of semiconductor material are formed within regions of dielectric material such as silicon dioxide. Active and/or passive devices are then formed in the pockets of semiconductor material. Examples of this type of process and structure can be seen in greater detail in patents of R. E. Jones, Jr., U.S. Pat. No. 3,357,871 issued Dec. 12, 1967 and the J. G. Kren, et al. U.S. Pat. No. 3,419,956 issued Jan. 7, 1969. A variation on this technique for forming dielectric regions which isolate semiconductor regions is shown in the V. Y. Doo U.S. Pat. No. 3,386,865, issued June 4, 1968 wherein a thermally grown silicon dioxide layer is formed on a substrate of silicon semiconductor material, openings formed in the silicon dioxide layer, epitaxial growth of silicon made in these openings well above the upper level of the silicon dioxide layer. Epitaxial layers do not grow where silicon dioxide coating is present, thus empty channels are formed. Pyrolytic $SiO_2$ is deposited on the top to fill the empty channels. The pyrolytic $SiO_2$ is then partly removed by abrading or differential etching to expose the epitaxial layers and to remove the large steps from the surface of the pyrolytic $SiO_2$. Finally, semiconductor devices are formed within these silicon epitaxial regions.

More recently improved dielectrically isolated semiconductor device structures and method of fabricating have been developed. These structures and method are described in commonly assigned patent applications Ser. No. 154,456 filed June 18, 1971 entitled "Method of Forming Dielectric Isolation for High Density Semiconductor Devices," Ser. No. 154,455 filed June 18, 1971 entitled "Method for Forming Dielectric Isolation for High Density Pedestal Semiconductor Devices," and Ser. No. 150,609 filed June 7, 1971 entitled "Dielectric Isolation for High Density Semiconductor Devices." The improved dielectrically isolated device structures and methods of fabrication make possible greater device density, simplify the manufacturing of the devices, decrease cost, and make possible increased yields.

In many applications it is desirable to provide matched complementary type devices in a common layer or substrate of an integrated circuit. However, since complementary devices are by deposition of opposite type conductivity for corresponding components, the conductivity type of the semiconductor substrate matches only that of one of the complementary devices. As a consequence, a region of an opposite conductivity must be provided within the base substrate for the other complementary device. This leads to problems in the control of impurity concentration. Impurity concentrations are especially critical in field effect devices having metal over oxide gate structures. In these devices a relatively lightly doped region is required under the gate electrode to provide inversion of conductivity of the channel to initial conduction between the source and drain.

One way of forming oppositely doped pockets in a silicon substrate is by etching holes in the substrate of a first conductivity type. Silicon dioxide is used for masking the etching. An epitaxial layer of a second conductivity type is then deposited over the entire surface. The epitaxial layer has single crystal structure in the etched holes, and polycrystalline structure elsewhere over the silicon dioxide layer. The surface of the wafer is then lapped to remove the large ridges of polycrystalline silicon. This operation is very expensive and hard to control.

Another way to form oppositely doped pockets in a silicon substrate is by diffusion of oppositely doped regions, corresponding to the pockets, into the substrate, followed by the deposition of an undoped epitaxial layer. The pockets are formed in the epitaxial layer by outdiffusion of the buried diffused regions. Alternately, the pocket of a first conductivity type can be formed by doping the epitaxial layer with a dopant of the first conductivity type. In this case, only the pocket of the second conductivity type is formed by outdiffusion of the impurity in the buried diffused region. The buried diffused region of the first conductivity type in the previously described process is thus eliminated. It is difficult, however, with the above pocket formation to control the surface concentration of the oppositely doped pockets because of the horizontal autodoping during epitaxial deposition. The gas flow in the epitaxial reactor has a parallel component to the surface of the substrate which carries the evaporated dopants from the diffused regions along the substrate. This causes unpredictable doping in the oppositely doped pockets. To reduce the effect of the linear autodoping, the pockets must be positioned a significant distance from each other. This reduces considerably the packing density.

More recently, ion implantation is also used to form oppositely doped pockets in silicon substrate. To obtain a pocket of more than one micron depth a 500 KV reactor is required which is expensive and represents a safety hazard in manufacturing environment.

This invention is an improved technique for achieving dielectric isolation of devices in an integrated circuit, which is particularly adapted to the usage of complementary devices.

SUMMARY OF THE INVENTION

An object of the present invention is to provide methods for manufacture of dielectric isolated semiconductor devices which allows increased density within the monolithic chip while not requiring difficult to control manufacturing techniques.

Another object of this invention is to provide a method particularly adapted for fabricating matched complementary devices in a semiconductor device.

Another object of this invention is to provide a new complementary device integrated circuit structure.

These and other objects of the invention are accomplished according to the broad aspects of the invention by depositing a surface layer of a dielectric material, preferably silicon nitride, on a major surface of a monocrystalline silicon substrate, removing portions of the layer to expose an annular grid of channels, thermally oxidizing the exposed surface areas of the channels on the substrate forming a grid of annular ridges of $SiO_2$, extending partly into the substrate and partly above the substrate, removing portions of the dielectric layer to expose at least additional surface areas on the substrate, selectively growing an epitaxial silicon layer over the additional surface areas, the resultant structure consisting of annular ridges of $SiO_2$ electrically isolating the sidewalls of pockets of epitaxial silicon, the surfaces of the ridges and the regions of the epitaxial silicon being substantially co-planar. In using the method and the structure for complementary semiconductor devices in the fabrication, at least one additional portion of the dielectric layer surrounded by the thermal $SiO_2$ ridge is removed and a first conductivity type impurity for semiconductors introduced into the substrate, a dielectric layer grown over the exposed surface, and another portion of the dielectric layer removed to expose at least a second area of the substrate. A second opposite type conductivity impurity is then introduced into the exposed regions, all of the dielectric layers removed, and an epitaxial layer of silicon deposited. Complementary sets of either FET or bipolar transistors are then fabricated in the resultant oppositely doped pockets of epitaxial material.

DESCRIPTION OF PREFERRED EMBODIMENTS

Figure 1:
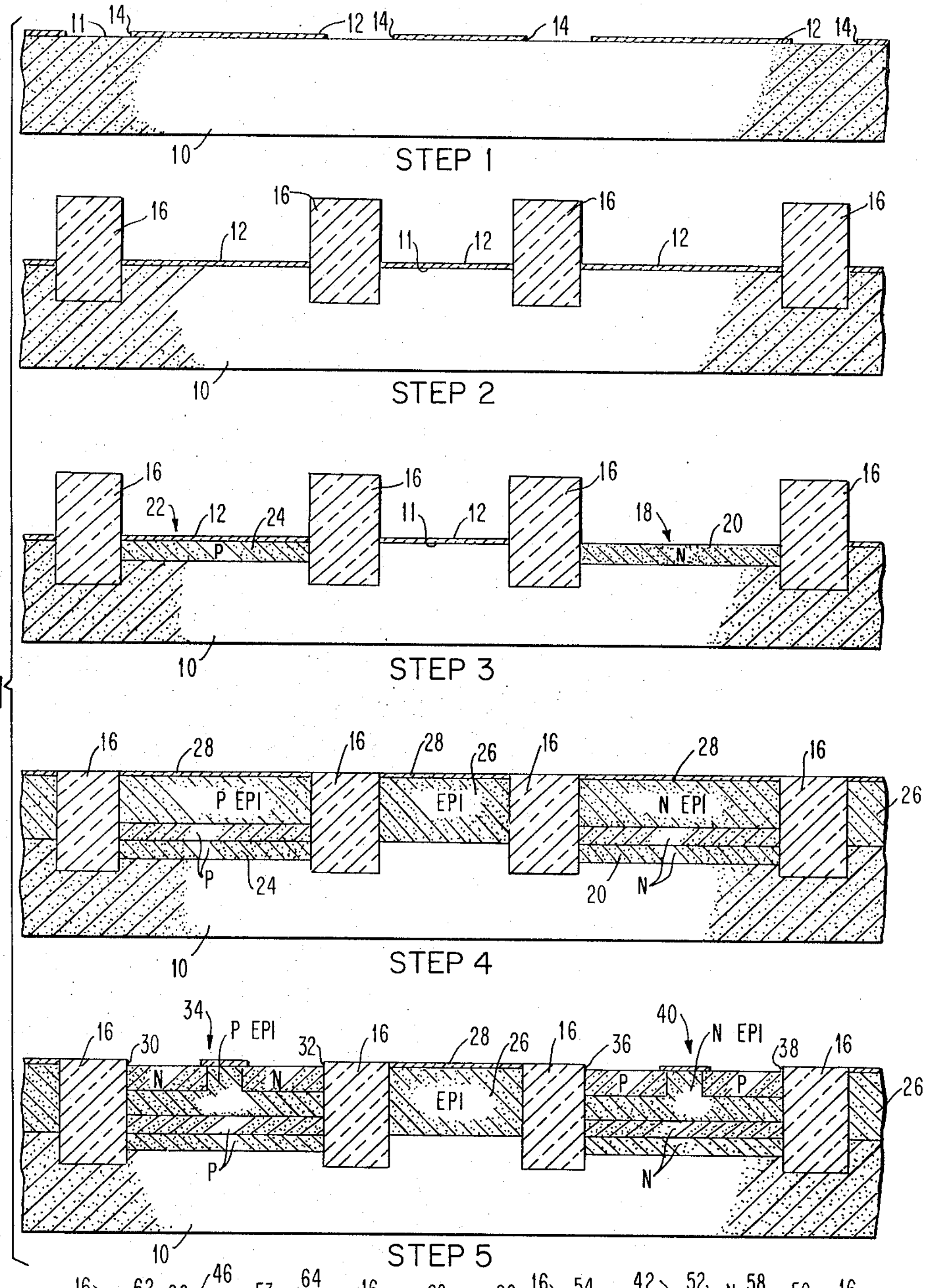
FIG. 1 depicts a sequence of sectioned elevational views illustrating a preferred embodiment of the method of the invention for fabricating complementary field effect transistors.

Referring now to the figures of the drawing, the first step in the process is illustrated in FIG. 1, step 1, wherein a layer 12 of dielectric material is deposited on a monocrystalline semiconductor substrate 10. Substrate 10 is a monocrystalline silicon wafer of relatively high resistivity doped with either a P type or N type conductivity for semiconductor materials. Preferably the resistivity of the material will be in the range of 100 ohm cm to 0.1 ohm cm with the impurity in a concentration in the range of $10^{14}$ to $10^{17}$. Surface 11 of substrate 10 can be aligned with any suitable crystalline orientation as defined by the Miller indices such as the <111> or <100>. Dielectric layer 12 is preferably silicon nitride having a thickness of at least 500A. The silicon nitride dielectric layer can be formed by either pyrolytic techniques by the reaction of silane and ammonium or other nitrogen containing compounds. Alternately, the layer can be deposited by reactive RF sputtering using a silicon target and a nitrogen gas atmosphere in a vacuum chamber. It is understood that the dielectric layer 12 can be of any suitable type material which will prevent or minimize the oxidation of the underlying silicon substrate as will be more clear in the explanation that follows. Openings 14 are formed in layer 12 which are generally annular in shape to surround a surface area of the substrate 10. In general, in an integrated circuit application, the openings constitute a grid network which will define the dielectric regions of the ultimate device. Openings 14 can be made by any suitable photolithographic technique. When the dielectric layer 12 is silicon nitride the openings can be made or the layer conveniently removed by a suitable etchant such as fused ammonium hydrogen phosphate as disclosed in U.S. Pat No. 3,706,612 entitled "Process for Etching Silicon Nitride," or hot phosphoric acid utilizing a mask which leaves exposed the desired areas of the layer 12 to be removed.

As indicated in step 2, the masked substrate 10 is exposed to an oxidizing environment at an elevated temperature either with or without the addition of water. The exposed surfaces of the substrate 10 are oxidized forming ridges 16 of thermal $SiO_2$. The ridges 16 extend down inwardly into substrate 10 below the original surface 11. Preferably, the ridges 16 can be formed by exposing the masked substrate 10 to an oxygen atmosphere, with or without a vapor pressure, and heated to a temperature in the range of 800° to 1,100°C. Alternately, ridges 16 could be formed by anodic oxidation of the silicon substrate 10. The height of ridges 16 above surface 11 is preferably in the range of 10,000 to 20,000A and the transverse width being in the range of 25,000 to 100,000A. It is understood that the dimension of the ridges 16 can vary with a degree of miniaturization of the device.

As shown in step 3, the portion of the dielectric layer 12, in area 18, is removed utilizing conventional photolithographic techniques and an impurity introduced into the top surface of wafer 10. When fabricating complementary transistors in a given pair of areas, the impurity introduced in the respective areas will be of the opposite conductivity type. In area 18, there is illustrated the portion of layer 12 removed and an N type impurity introduced forming region 20. After the impurity is introduced into substrate 10, the surface is again masked with a dielectric layer, as for example layer of $SiO_2$, overlying region 24. The masking layer is preferably thermal $SiO_2$ which can be formed by known techniques. The layer prevents the introduction of one type conductivity impurity, while the opposite type conductivity impurity is introduced in other regions. In the associated region 22 a P type impurity is introduced forming region 24.

As illustrated in step 4, an epitaxial layer 26 is selectively deposited on the top surface on substrate 10. The dielectric layer 12, and any reoxidized layers are removed prior to deposition of epitaxial layer 26. Conditions during growth of layer 26 are controlled such that there is no deposition of silicon over ridges 16. Typically, growth conditions that will produce this result are accomplished by flowing a mixture of silane, hydrogen and a carrier gas, as for example nitrogen, through the reactor over the surface of the substrate 10 which is maintained in the temperature in the range of 950° to 1,050°C. Obviously, other silicon compounds can be used as reactant gases as for example, silicon tetrachloride or silicon bromide. The techniques for depositing silicon on a monocrystalline substrate are well known in the art and do not constitute per se any part of the invention. As indicated in step 4, diffused regions 24 ad 20 diffuse upwardly during the epitaxial deposition to form a low resistivity region in the vicinity of the substrate-epitaxial layer interface as well as providing a background dopant in the upper portions of layer 26. The surface concentration of the dopant will vary with layer thickness, and the dopant surface concentration of regions 24 and 20. These parameters can be varied to obtain the desired dopant concentration both N and P conductivity types in the monocrystalline pockets. In depositing epitaxial layer 26 preferably no dopant will be included in the reactant gas stream to the reactor. The dopant in the pockets surrounded by dielectric ridges 16 derive the dopant of the low resistivity regions 20 and 24. The surface of the layer 26 is then reoxidized forming a silicon dioxide layer 28.

One of the two diffused buried regions 20 and/or 24 can be eliminated. If region 20 with N type of doping is eliminated, the epitaxial layer is doped with N type of dopant during epitaxial deposition to form the N type of pockets. The N type epitaxial layer above the P buried region 24 will be inverted into P type by outdiffusion, thus forming P pockets. The control of interface doping of the oppositely doped semiconductor pockets is very important for FET transistors. Accurate control of surface doping of the pockets can be obtained by two alternative methods. First, by the outdiffusion of the two oppositely doped buried layers as illustrated in FIG. 1, step 3. Second, by using only the first conductivity type of buried layers which determine the surface doping of the pockets of the first conductivity type. The surface doping of th second conductivity type of pockets is obtained by doping the epitaxial layer with a dopont of second conductivity type. In both cases, the annular $SiO_2$ rings eliminate the horizontal autodoping of the buried layers during epitaxial deposition and thereby reducing considerably the size of pockets and the capacitance.

Referring now to step 5, source and drain openings 30 and 32 are made in layer 28 and an N type semiconductor dopant introduced either by ion implantation or diffusion. This will form an N channel FET device 34. In a similar manner, source and drain openings 36 and 38 are made in layer 28, and P type impurity introduced forming P channel FET device 40. As is believed apparant to one skilled in the art, many of the same steps used to form the FET devices can be used to form bipolar devices, resistors, or the like.

Figure 2:
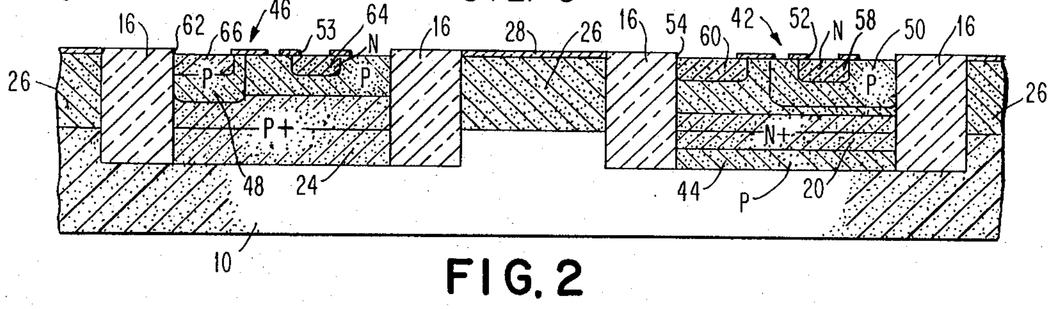
FIG. 2 is an elevational view in broken cross-section illustrating a pair of complementary bipolar transistors fabricated by the method of the invention.

Referring now to FIG. 2, there is illustrated another embodiment of the process and structure of the invention wherein the complementary devices are NPN and PNP transistors. The process for forming complementary bipolar transistors is basically similar to the steps shown in FIG. 1, however, both transistors must be electrically isolated. Therefore, an additional step is necessary in order to electrically isolate transistor 42. A P type region 44 is provided which dielectrically isolates the high conductivity regions 20. This can be accomplished by double diffusing through opening 18, as in step 3, an N type dopant, and a P type dopant having greater mobility, or the diffusions can be performed sequentially. During the growth of epitaxial layer 26 which is doped with an N type dopant, the P type dopant in region 44 diffuses further into the substrate 10 than the N type dopant in region 20, thereby forming a PN junction which electrically isolates the device 42. A base window in transistor 42 and a collector window in transistor 46 are made in layer 28, and a P type dopant introduced therein. In transistor 46 region 48 is formed. In transistor 42 base region 50 is formed. After the base diffusion is made the base windows in transistor 42 and 46 are reoxidized, and emitter window 52 and collector contact opening 54 in transistor 42 are opened. An N-type impurity introduced forming emitter and collector contacts 58 and 60, respectively. Emitter opening 53 and the collector contact opening 62 in transistor 46 are opened, and a P type dopant introduced forming emitter and collector contact regions 64 and 66, respectively. Subsequently, all contact openings are opened and the metallurgy deposited in the conventional manner. In FIG. 1, step 5 and FIG. 2, the metallurgy system is not illustrated in order to more clearly depict the necessary process steps, and since it forms no part of the invention.

While the invention has been particularly shown and described with reference to preferred embodiments thereof, it will be understood by those skilled in the art that various changes in form and detail may be made therein without departing from the spirit and scope of the invention.

What is claimed is:

1. A method for fabricating a planar dielectrically isolated semiconductor structure comprising:

providing a monocrystalline silicon substrate embodying an impurity for semiconductors of a first type, depositing a surface layer of dielectric material on a major surface of said substrate, removing portions of said layer to expose surface area portions to define annular channels, thermally oxidizing the exposed surface areas of said substrate thereby forming annular ridges of $SiO_2$ which extend to a predetermined distance above and below the surface of said substrate, removing portions of said dielectric layer to expose at least additional surface areas of said substrate, diffusing an impurity for semiconductors of a second opposite type into said silicon substrate through the exposed surface areas forming a high conductivity region and a generally laterally extending P-N junction within said substrate, selectively growing an epitaxial silicon layer over said additional surface areas, said annular ridges of $SiO_2$ and said laterally extending P-N junction electrically isolating pockets of epitaxial silicon, the surfaces of said ridges and said regions of epitaxial silicon substantially co-planar.

selectively introducing impurities for semiconductors into said insulated pockets of epitaxial silicon forming active semiconductor devices.

2. The method of claim 1 wherein said layer of dielectric material is silicon nitride.

3. The method of claim 1 wherein there is fabricated in said structure at least one pair of complementary semiconductor devices comprising;

subsequent to thermally oxidizing the annular channels of the exposed surface of the substrate, a portion of the surface layer of dielectric material is removed to expose only the first one of a pair of areas of surface layer portions surrounded by ridges of thermal $SiO_2$, and the second type impurity for semiconductors is introduced into the substrate in the region exposed by the removal of the surface dielectric layer.

forming a dielectric layer over the exposed surface of the substrate, removing a portion of the surface layer of dielectric material to expose the second of a pair of areas of surface layer portions surrounded by ridges of thermal $SiO_2$, introducing a first conductivity type impurity for semiconductors into the region exposed by the removal of the surface dielectric layer, removing the dielectric layer from the surface of the substrate, thermally oxidizing the surface of epitaxial layer subsequent to selective epitaxial silicon growth, and fabricating active devices of opposite type in the pair of resultant epitaxial silicon pockets.

4. The method of claim 1 wherein there is fabricated at least one pair of complementary semiconductor devices comprising;

subsequent to thermally oxidizing the annular channels of the exposed surface of the substrate, the portions of the surface layer of dielectric material are removed to expose only a first one of a pair of areas of surface layer portions surrounded by thermal $SiO_2$, and subsequent to introducing a second conductivity type impurity for semiconductors into the substrate in the region exposed by the removal of the surface dielectric layer, portions of the surface layer of dielectric material are removed to expose a second one of a pair of areas of surface layer portions surrounded by thermal $SiO_2$, a first conductivity type impurity for semiconductors is embodied in said epitaxial silicon layer in a concentration sufficient to provide a first conductivity to the epitaxial layer over said second one of a pair of areas, but insufficient in the epitaxial layer over said first one of a pair of areas to overcome the impurity outdiffused from the high conductivity region, fabricating active devices of opposite type in said pair of resultant epitaxial silicon pockets.

5. The method of claim 1 wherein there is fabricated at least one pair of complementary semiconductor devices comprising;

subsequent to thermally oxidizing the annular channels of the exposed surface of this substrate, portions of the surface layer of dielectric material are removed to expose both the first and second areas of a pair of areas of surface layer portions surrounded by ridges of thermal $SiO_2$, introducing a second conductivity type impurity for semiconductors into the substrate in the regions exposed by the removal of the surface dielectric layer, forming a masking layer over the first one of a pair of areas of surface of the substrate, leaving exposed the second one of a pair of areas of surface layer portions surrounded by ridges of thermal $SiO_2$, introducing a first opposite conductivity type impurity for semiconductors into the exposed area, removing the masking layer, and embodying a second opposite conductivity type dopant for semiconductors in said epitaxial layer, fabricating active devices of opposite type in the pair of resultant epitaxial silicon pockets.

* * * * *